Aug. 15, 1967 D. J. CRIMMINS 3,336,565

MEANS FOR TERMINATING FLEXIBLE CONDUCTOR ETCHINGS

Filed March 26, 1964 2 Sheets-Sheet 1

INVENTOR.
DAVID J. CRIMMINS
BY
Kenyon & Kenyon
ATTORNEYS

Aug. 15, 1967 D. J. CRIMMINS 3,336,565
MEANS FOR TERMINATING FLEXIBLE CONDUCTOR ETCHINGS
Filed March 26, 1964 2 Sheets-Sheet 2

INVENTOR.
DAVID J. CRIMMINS
BY Kenyon & Kenyon
ATTORNEYS

United States Patent Office 3,336,565

Patented Aug. 15, 1967

3,336,565

MEANS FOR TERMINATING FLEXIBLE CONDUCTOR ETCHINGS

David J. Crimmins, Pennington, N.J., assignor to The Thomas & Betts Co., Elizabeth, N.J., a corporation of New Jersey Filed Mar. 26, 1964, Ser. No. 355,045

5 Claims. (Cl. 339—107)

This invention relates to improvements for terminating flexible etchings and, more particularly, relates to a novel connector means useful in effecting electrical connections between the conductors of a flexible etching and the conductors of a separate electrical unit.

Flexible etchings have come into widespread use as a means to provide a base for electric circuits, particularly where problems of space are involved. A flexible etching permits circuits to be formed by the use of an etched circuit pattern and the physical attachment of elements to the etching at appropriate points of the circuit. In order to interconnect the conductors which form the circuit portion of the flexible etching to another element, a connector is required.

It is an object of this invention to provide for effective mechanical means which are capable of firmly supporting a portion of the flexible etching, relieving the stress on the etching itself and, in addition, providing for means to effect good electrical contact between the conductors of the flexible etching and the pins on a separate connector attached to other circuit elements.

It is another object of this invention to provide a method for and a means capable of automating the termination of flexible etched circuitry in order to provide for high speed automated etching terminations and to provide for extremely high reliability of interconnection by providing direct conductor to contact connection.

In brief, the system of this invention involves the preparation of a flexible etching, prepared in the usual way with conductor elements which are formed so as to leave a space between the end of the conductors and the end of the flexible base material. It has been customary in the past to form the conductors so that the etched conductors extend completely to the end of the base material. The purpose of the space on the flexible etching as described herein will be fully explained below.

The mechanical elements of the device of this invention, in addition to the specially prepared flexible etching involved, are spring pressure means, which are formed in a continuous strip or coil and supplied in that fashion. The spring pressure means is designed to be supported within a connector housing of novel construction, which is designed to receive the spring pressure means to hold it in a fixed position and includes means for holding the flexible etching so as to relieve the strain on the portion of the etching which is in contact with the spring pressure means. Thus, the connector housing, which is preferably formed from a plastic material, which, since the stresses on the connector housing are relieved by the spring pressure member, can be quite thin while still providing high degrees of contact pressure between the pins of a separate connector and the flexible etching connector of this invention.

One of the features of the housing is the provision of a snap-detent action in the opening into which the contacts of the separate element are inserted so as to provide for a positive lock of the contacts in the connector housing of this invention.

The system of this invention provides a means to have economical and extremely reliable terminations for etchings which lends itself to high volume production at low cost.

This invention also involves the method of forming etching terminations involving the steps of mechanically gripping the end of the flexible etching at one end of pressure means, wrapping the flexible etching about the opposite end of spring pressure means so as to interpose a portion of the pressure means between the end which is mechanically held and the remainder of the etching and then positioning the flexible etching within an insulating housing, such as to provide for pressure contact and support for the etching while relieving stresses on the etching and the housing.

The above features and objects of this invention will be more fully appreciated along with further objects and advantages described below when the method and device of this invention is explained in the detailed description which follows along with the drawings, in which.

Figures 1, 2, 3:
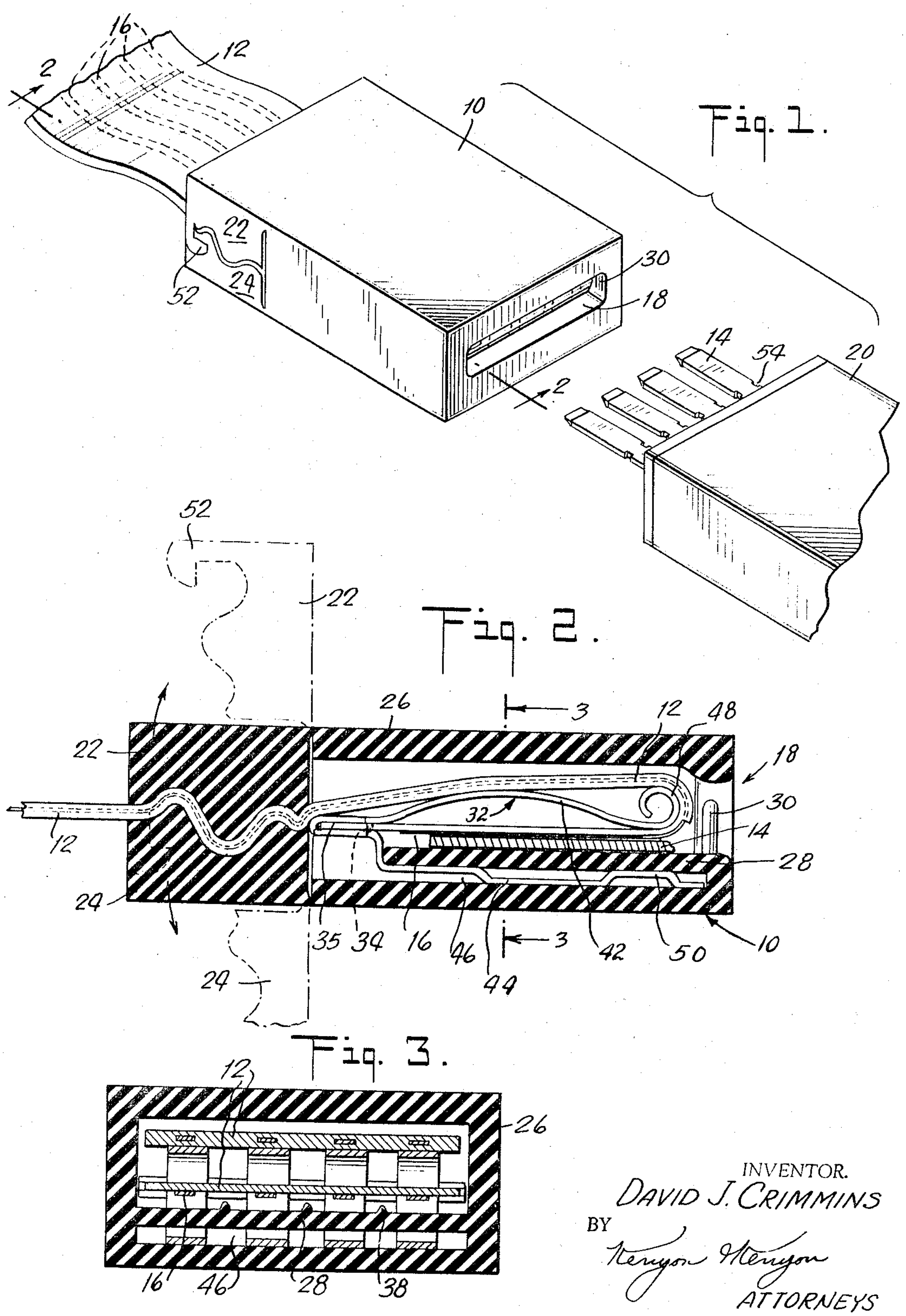
FIG. 1 is a perspective view of the device of this invention in a completed form, including a portion of a separate connector having contact pins formed thereon.
FIG. 2 is a cross-sectional view of the connector housing and etching taken along line 2—2 of FIG. 1.
FIG. 3 is a cross-sectional view of the device of this invention taken along line 3—3 of FIG. 2.

Referring now to FIG. 1, it may be seen that the following elements are involved in the device of this invention. A housing 10 which supports a flexible etching 12 is employed to provide a means to terminate etching 12 in order that contact pins 14 may be electrically connected to conductors 16 of etching 12 by the insertion of pins 14 into opening 18 in housing 10.

Pins 14 are illustrated as being flat pins, but it will be appreciated that they may be of any ordinary type of contact pin. Pins 14 are illustrated as being attached to a separate circuit element 20 which is to be connected by means of pins 14 to the conductors 16 of etching 12.

The housing 10 is a hollow member of insulating material, preferably plastic, which may be molded. Strain relief means, such as hinged end portions 22, 24, are joined to the hollow body portion 26 either by thin sections or plastic, as illustrated, or by mechanical hinges, if such is desirable. The hollow body portion 26 of housing 10 is provided with a spring pressure means support element 28, as illustrated in FIG. 2, and is also provided with raised locking elements 30 positioned in opening 18.

A spring pressure means 32 is formed so as to be capable of being positioned within the hollow body portion 26 of connector housing 10 and to be supported by the support element 28. The etching 12 is positioned within housing 10, as illustrated in FIG. 2, and is mechanically attached to spring pressure means 32 by means of a struck-out tab 34 which penetrates the inner end of etching 12.

Figures 4, 5, 6, 7:
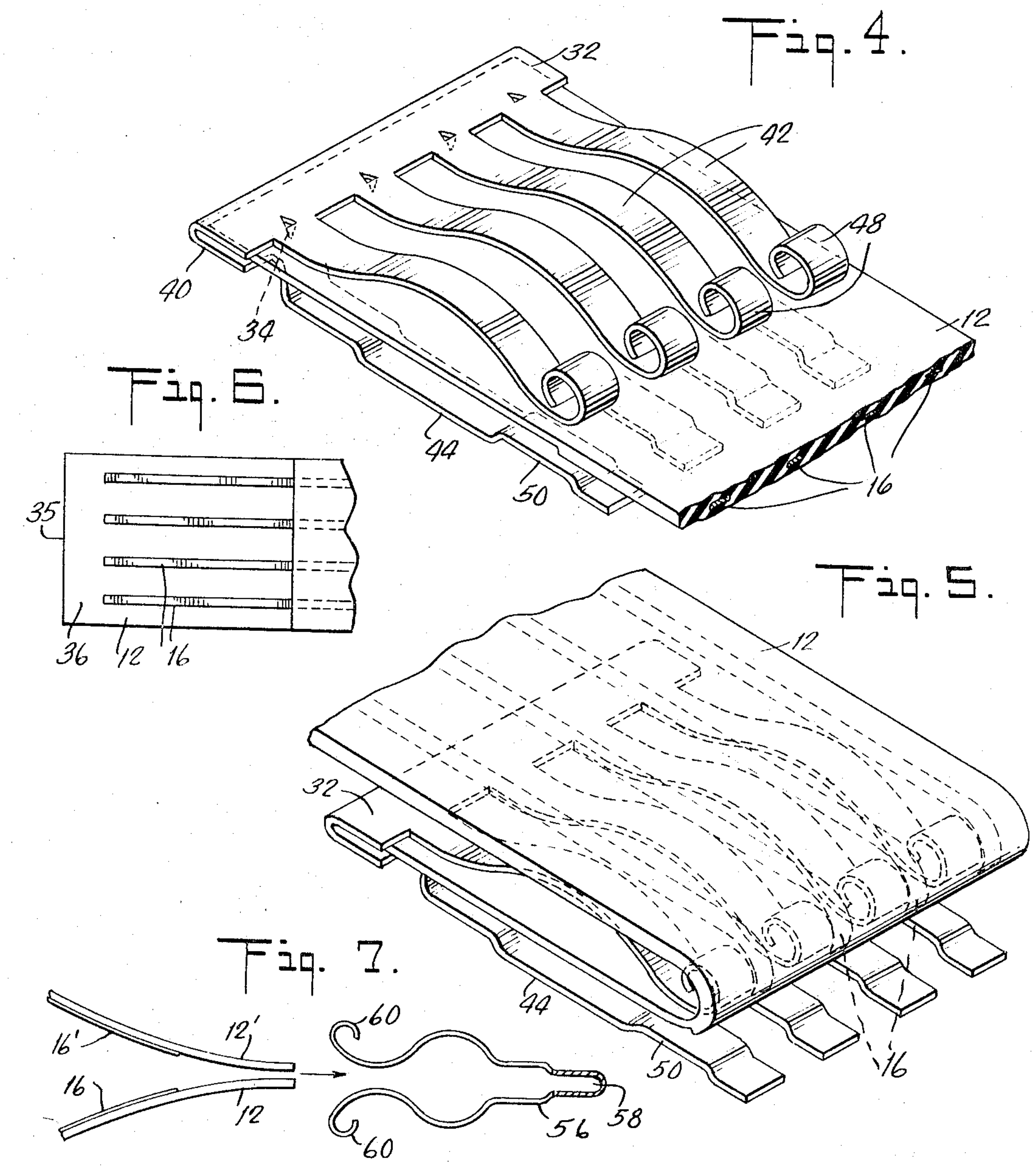
FIG. 4 is a perspective view of the spring pressure means of this invention illustrating the first step of insertion of the flexible etching in said spring pressure means.
FIG. 5 is another perspective view of the device illustrated in FIG. 4 illustrating the second step of formation of the termination of a flexible etching.
FIG. 6 is a plan view of the terminal portion of a specially prepared flexible etching.
FIG. 7 is a side view of a modification of the method of and device of this invention wherein termination of two flexible etchings is involved illustrating the beginning of the insertion step.

The etching 12 is formed from a base material which is laminated to a conductor material, and by techniques well known in the art, the conductor material is etched away to form conductors 16. As illustrated in FIG. 6, the conductors 16 in the etching employed in this invention end so as to provide a space 36 between their ends and the end 35 of etching 12. The insulation covering the ends of conductors 16 may be removed by any well-known means; for example, if etching 12 is flexible multi-conductor cable having a plurality of etched conductors bonded between two sheets of insulation material, the upper sheet of insulation material may be stripped away by abrasion thereof or dissolution to expose the ends of conductors 16. On the other hand, if etching 12 comprises a lower flexible strip of insulation material upon which conductors 16 have been etched, the upper surfaces of conductors 16 may be insulated by bonding an upper strip of insulation material thereto and terminating said upper strip of insulation material short of the ends of conductors 16 so as to expose said ends. The base material is a non-conductor, thereby permitting the attachment of struck-out tab 34 into the portion 36 so that the mechanical attachment of spring means 32, which is preferably a metallic element, will not result in an electrical connection between the conductors 16 and spring means 32.

Guide rails 38 are provided, as illustrated in FIG. 3, to assist in locating pins 14 within opening 18.

The particular construction of spring pressure means 32 may be subject to different configurations, depending upon a particular need. A preferred form is illustrated in the figures and details thereof are particularly illustrated in FIGS. 4 and 5. Generally, the spring pressure means 32 should have an end 40, which is formed as illustrated in FIGS. 4 and 5, such that it will receive and support the inner end 36 of etching 12. The bent end 40 also performs the function of making the longitudinally extending leaf-spring portions 42 have a fixed end position. The bottom portions 44 of spring pressure means 32 are formed as illustrated in FIGS. 2, 4 and 5, and are adapted to be positioned within the openings 46 between the support member 28 and the top of the bottom wall of hollow portion 26.

The spring pressure means 32 is formed in long strips, and prior to the insertion of etching 12, the outer ends 48 of leaf spring 42 will be in contact with the raised shoulder portions 50 of bottom portion 44 of spring pressure means 32.

The formation of the bottom portions 44 is such as to rigidly support spring pressure means 32 within the hollow portion 26 of housing 10.

The method of forming flexible etching terminations of this invention involves the steps illustrated in FIGS. 4 and 5. This method is preferably automated so as to provide for a high volume of terminations at a low unit cost. The method involves the steps of positioning the pre-formed spring pressure means 32 in a punch-press type of device (not shown), then inserting the end 35 of etching 12 into the bent end portion 40 of spring pressure means 32 as far as possible. Then the punch-press device is forced downwardly so as to strike out tabs 34 and cause them to penetrate etching 12 in the space 36, thereby firmly attaching etching 12 to spring pressure means 32.

It should be noted here that, since spring pressure means 32 will normally be formed from spring steel, or the like, conductors 16 of etching 12 are not in contact with any portion of the metal of spring pressure means 32. Thus, as illustrated in FIG. 2, the conductors are all separated from the spring pressure means 32 by a definite space.

The next step in the method of this invention is illustrated in FIG. 5, which shows that the flexible etching 12 is bent around the ends 48 of leaf spring portions 42 in close fitting relation. In this position conductors 16, which may be fully or only partially exposed, as illustrated in FIG. 2, are in position for contact with pins 14.

The next step in the method involves the insertion of the sub-assembly of the spring pressure means 32 and the flexible etching 12 into the end of housing 10 opposite the opening 18. In order that this may be accomplished, the hinged members 22, 24 are open, thereby permitting complete access to the inner portion of hollow portion 26 of housing 10. Thus, the bottom portions 44 of spring pressure means 32 are inserted into the openings 46 in housing 10 to fix the position of spring pressure means 32 within housing 10. Next the flexible etching 12 is gripped by end members 22, 24 of housing 10 in a manner illustrated in FIG. 2 so that the portion of etching 12 held between the elements 22, 24 is firmly held. This permits the relief of any strain on etching 12 and thereby on spring pressure means 32.

Latching means, such as illustrated at 52, may be formed on end portion 22 which mate with an opening in end portion 24 so as to latch and lock portions 22, 24, with etching 12 in place between them. A particular form of space between members 22, 24 is illustrated, but it will be appreciated that such form may be of any suitable shape which provides for strain relief and for firm gripping of etching 12.

An individual spring pressure means 32 is preferably severed from the continuous strip of means 32 immediately following, or at the time of, the attachment by means of struckout tabs 34 of etching 12 to spring pressure means 32 by the same punch-pressed device. It may, however, be desirable to form a plurality of etching 12 terminations and then to sever strip 32 at a later step.

In the figures a four-conductor etching is employed, but it will be appreciated that the number of conductors may be any desirable number.

Once the strip of spring pressure means 32 has been severed, so as to provide for an individual etching termination, that sub-assembly is positioned with housing 10, as described above. Following the locking of end portions 22, 24 together, the termination is complete. It will be seen that there has been provided an effective termination means for etchings 12, which is simple and highly reliable. In addition, the method of this invention provides a means whereby the terminal of etchings 12 may be accomplished in an automated fashion, thus lowering unit costs considerably while providing for a high volume of production.

Connection of pins 14 to conductors 16 is accomplished by insertion of pins 14 through opening 18 until notches or detents 54 contact locking elements 30 positioned on both sides of opening 18. As illustrated in FIG. 2, pins 14 are in intimate contact under pressure provided by leaf spring elements 42 with the conductors 16 of etching 12. This provides for a high degree of reliability. It will be appreciated that the spring pressure means 32 may be such as to provide any desired degree of contact pressure between conductors 16 and pins 14.

Figure 8:
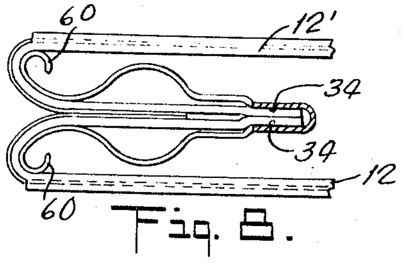
FIG. 8 is a side view of the form of the device of this invention illustrating the second step of forming the termination for a pair of flexible etchings which are to be interconnected.

In the modification illustrated in FIGS. 7 and 8, a spring pressure means 56 is provided, which is adapted to interconnect a pair of flexible etchings 12 so that their conductors 16, 16' are forced into intimate contact with each other. The method of forming a double etching termination is similar to that described above, except that the first step involves the insertion of the pair of etchings 12, 12' into the opening end of spring pressure means 56 and the physical attachment by means of struck-out tabs 34 to the closed end portion 58. Following the mechanical attachment step of both etchings to spring pressure means 56, etchings 12, 12' are wrapped around the ends 60 in the manner illustrated in FIG. 8 and then the sub-assembly illustrated in FIG. 8 is positioned within a housing similar to that illustrated in FIG. 1, except that two pairs of end portions are provided, one for each of conductor etchings 12, 12'. The housing for the double etching termination sub-assembly illustrated in FIG. 8 would also involve a pair of spring pressure support members similar to that illustrated at 28.

It will be seen from the above description that the device of this invention provides for an economical and reliable means for terminating flexible etchings and that the method of this invention makes possible an automated termination system providing for high production volume and low unit cost.

What is claimed is:

1. A terminal for terminating flexible etchings comprising spring pressure means, said spring pressure means having an upper spring portion and a lower portion such that a flexible etching may be affixed between said upper spring portion and said lower portion, said flexible etching being bent around the free end of said upper spring portion, housing means within which said spring pressure means is supported and positioned, said housing means being provided with support means adapted to fixedly secure said spring pressure means within said housing, said housing having an opening at one end thereof adapted to receive contacts from an external connector such that said contacts will come into contact with the conductors of said flexible etching and will be held under pressure with said conductors by said spring pressure means, said housing being further provided at the other end thereof with gripping means adapted to fixedly hold said flexible etching, thereby relieving the strain on the portion of said etching to which said spring pressure means is affixed, wherein said gripping means comprises a pair of opposed end portions hingedly affixed to said housing such that after said spring pressure means has been positioned within said housing means, said end portions may be closed providing a gripping action, thereby firmly holding said flexible etching between the opposed surfaces of said end portions and relieving the strain on the end portion of the flexible etching affixed to the spring pressure means.

2. The terminal for terminating flexible etchings of claim 1 wherein said end portions are provided with latching means for maintaining said end portions in engaging contact with said flexible etching.

3. A terminal for terminating flexible etchings comprising spring pressure means, said spring pressure means having an upper spring portion and a lower portion such that a flexible etching may be affixed between said upper spring portion and said lower portion, said flexible etching being bent around the free end of said upper spring portion, housing means within which said spring pressure means is supported and positioned, said housing means being provided with support means adapted to fixedly secure said spring pressure means within said housing, said housing having an opening at one end thereof adapted to receive contacts from an external connector such that said contacts will come into contact with the conductors of said flexible etching and will be held under pressure with said conductors by said spring pressure means, said housing being further provided at the other end thereof with gripping means adapted to fixedly hold said flexible etching, thereby relieving the strain on the portion of said etching to which said spring pressure means is affixed, and including locking means positioned within the opening of said housing means for locking said contacts within said housing and in contact with the conductors of said flexible etching.

4. A terminal for terminating a pair of flexible etchings comprising a spring pressure means adapted to interconnect a pair of flexible etchings such that the respective conductors of said flexible etchings are forced into intimate contact with each other, housing means adapted to support said spring pressure means, and within which said spring pressure means is positioned, said spring pressure means comprising a bent portion and an upper and a lower portion unitary with said bent portion such that the ends of said pair of flexible etchings may be affixed within said bent portion and each of said pair of flexible etchings may be respectively bent around the free ends of said upper and said lower portions.

5. The terminal for terminating a pair of flexible etchings of claim 4 wherein said housing means is provided with a pair of gripping means, each of said gripping means adapted to grip one of said flexible etchings such that the strain on the end portion of the said flexible etching affixed to said spring pressure means is relieved.

References Cited

UNITED STATES PATENTS

| | | | |
|---|---|---|---|
| 2,590,886 | 4/1952 | Pedersen | 39—107 |
| 2,963,392 | 12/1960 | Dahlgren | 154—2.2 |
| 2,964,587 | 12/1960 | Minot | 174—117 |
| 3,059,211 | 10/1962 | Thomas et al. | 339—17 |
| 3,084,302 | 4/1963 | Braentigam | 339—176 |
| 3,144,288 | 8/1964 | Grant | 339—176 |
| 3,149,896 | 9/1964 | Hall | 339—17 |
| 3,154,365 | 10/1964 | Crimmins | 339—176 |
| 3,221,095 | 11/1965 | Cook | 339—17 X |

MARVIN A. CHAMPION, *Primary Examiner.*

ALFRED S. TRASK, EDWARD C. ALLEN, *Examiners.*